United States Patent [19]

Richman

[11] 4,298,769
[45] Nov. 3, 1981

[54] HERMETIC PLASTIC DUAL-IN-LINE PACKAGE FOR A SEMICONDUCTOR INTEGRATED CIRCUIT

[75] Inventor: Paul Richman, St. James, N.Y.

[73] Assignee: Standard Microsystems Corp., Hauppauge, N.Y.

[21] Appl. No.: 229,193

[22] Filed: Jan. 28, 1981

Related U.S. Application Data

[63] Continuation of Ser. No. 103,727, Dec. 14, 1979, abandoned, which is a continuation of Ser. No. 916,837, Jun. 19, 1978, abandoned.

[51] Int. Cl.³ .............................................. H05K 5/06
[52] U.S. Cl. ................................ 174/52 FP; 29/588; 357/74
[58] Field of Search ..................... 174/52 FP, 52 PE; 357/72, 73, 74; 29/588, 589

[56] References Cited

U.S. PATENT DOCUMENTS

| 3,697,666 | 10/1972 | Wakley | 174/52 FP |
| 3,706,840 | 12/1972 | Moyle | 174/52 PE |
| 3,760,090 | 9/1973 | Fowler | 174/52 FP |
| 4,038,488 | 7/1977 | Lin | 174/52 FP |

Primary Examiner—Bruce A. Reynolds
Assistant Examiner—D. A. Tone
Attorney, Agent, or Firm—Hopgood, Calimafde, Kalil, Blaustein & Judlowe

[57] ABSTRACT

A hermetic plastic package for a semiconductor integrated circuit chip includes a chip carrier provided with a plurality of conducting fingers that terminate at its underside. The carrier includes a pedestal onto which a semiconductor chip is bonded and wires are connected between the bonding pads on the chip and associated fingers on the carrier. A lid is placed over the carrier and is hermetically sealed with the chip inside the cavity of the carrier. The finger terminations on the underside of the carrier are connected to a plurality of leads which have inner portions that extend outward in a direction parallel to the underside of the carrier and end portions that are bent substantially perpendicular to the underside of the carrier configuration. The chip carrier and the inner portions of the leads that lie parallel to the underside of the chip carrier are encased in a plastic or epoxy compound.

6 Claims, 5 Drawing Figures

HERMETIC PLASTIC DUAL-IN-LINE PACKAGE FOR A SEMICONDUCTOR INTEGRATED CIRCUIT

This is a continuation of Ser. No. 103,727, filed on Dec. 14, 1979, now abandoned, which is a continuation of Ser. No. 916,837 filed on June 19, 1978, now abandoned.

The present invention relates generally to packages for semiconductor chips or wafers, and more particularly to an improved, low-cost, hermetically sealed package.

Semiconductor chips or wafers in which highly complex integrated circuits are formed are in widespread use in a multitude of different applications. In use, the chips are contained in a package which provides physical protection for the chip and also provides for electrical connections to be made between the integrated circuit formed on the chip and the external portions of the system or circuit of which the integrated circuit on the chip is one component.

The most widely employed package used for semiconductor chips is the so-called dual-in-line package, which is designed either for insertion into sockets or directly into printed circuit boards. This type of package is particularly well suited for installation by the use of standard automatic insertion equipment. The dual-in-line package includes a housing for the chip from which two parallel rows of conductive leads extend downwardly along both sides of the housing. The leads are electrically connected to the chip by means of conductors located within the interior of the package, which are, in turn, connected by wires to bonding locations or pads on the chip.

Heretofore, the integrated circuit designer who desired to employ a dual-in-line package had to choose between a ceramic package, which provided a hermetic seal for the chip and which was relatively high in price, and a plastic package, which was lower in price than the ceramic package but did not provide a hermetic seal, such that the semiconductor chip contained in the plastic package was subjected to ambient conditions and thus to possible long-term degradation and reduction in reliability. That is, in the conventional plastic dual-in-line package, moisture is able to penetrate through the package to the semiconductor chip contained therein by traveling along voids adjacent the metal conductors, and, by capillary action, will eventually reach the interior bonding wires and the chip. As a result, ceramic dual-in-line packages are still used in many applications, particularly where reliability is an important factor, even though their cost is considerably higher than that of comparable plastic packages.

In an attempt to reduce the cost of a hermetic package, a package designated as a chip carrier or leadless-inverted device has recently been developed and proposed for use by the electronic industry for packaging semiconductor chips. These packages comprise a ceramic-mounting pedestal with surrounding conduction fingers for connection to the bonding pads on the chip, and a separate ceramic or metal lid. This package, unlike the dual-in-line package, has no leads projecting therefrom and thus has not received widespread acceptance by the electronics industry despite its reduced cost, since it cannot be as readily inserted into printed circuit boards and cannot be used with standard automatic insertion equipment.

There thus remains a significant need for a low-cost and yet hermetically sealed package having a dual-in-line configuration.

It is, therefore, an object of the present invention to provide an improved, low-cost hermetic package for a semiconductor chip.

It is a further object of the present invention to provide a hermetic low-cost package in a dual-in-line configuration.

It is another object of the present invention to provide a package for a semiconductor chip which has the hermetic features of a ceramic package and the low cost of nonhermetic plastic package.

To these ends, the package of the present invention includes a chip carrier which has electrical fingers terminating at its underside and connected and attached to a plurality of leads. The semiconductor chip is bonded to the pedestal of the chip carrier and the bonding pads on the chip are connected by wires to the fingers on the chip carrier. A lid is placed over the chip carrier, thereby to hermetically seal the chip within the cavity in the chip carrier. The end of each lead is bent downwards into a substantially vertical position and the bent portions of the leads are arranged in two perpendicular rows to form a dual-in-line configuration. The structure is then injection molded with a plastic sealant, such as an epoxy or silicone compound, with the vertically bent portions of the leads remaining exposed to enable the device to be inserted, for example, into a socket or printed circuit board.

To the accomplishment of the above and such other objects as may hereinafter appear, the present invention relates to a package for a semiconductor chip, substantially as defined in the appended claims and as described in the following specification, as considered with the accompanying drawings, in which:

Figure 1:
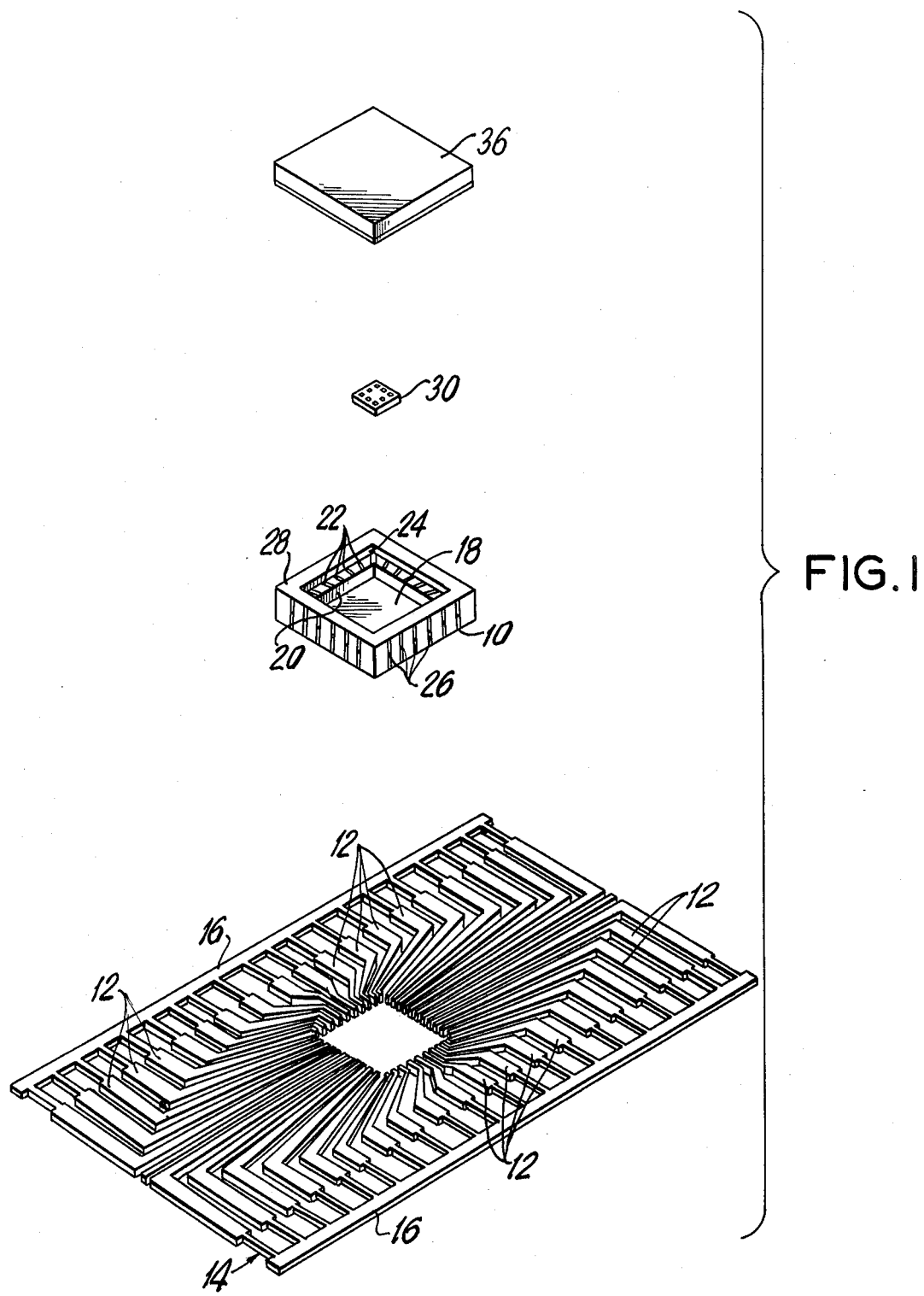
FIG. 1 is an exploded perspective view of the elements of the package of the present invention.

Referring to the figures, there is shown in FIG. 1 the components used to fabricate the package of the invention and the manner in which these components are assembled to form the package.

Figure 4:
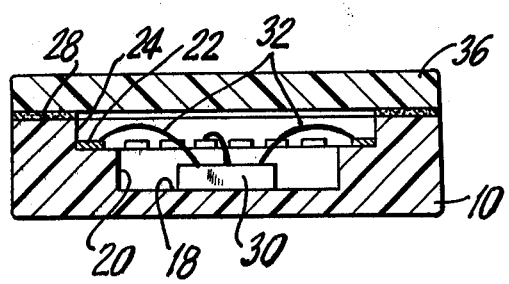
FIG. 4 is a cross-sectional view of the chip carrier, chip, and lid included in the package.

In the fabrication of the package, a chip carrier 10 made of a suitable ceramic material is attached to a plurality of leads 12, which are a part of a lead frame 14. At the initial stage of the fabrication of the package shown in FIG. 1, the leads 12 on opposite sides of the lead frame are interconnected to one another by means of parallel shorting strips 16, which extend along opposing edges of the lead frame. Carrier 10 may be, as shown, square in shape and includes a recessed portion 18 or pedestal surrounded by a raised inner wall 20 (FIG. 4). A plurality of spaced conductive fingers 22 are formed on top of wall 20, which, in turn, is surrounded by a higher outer wall 24. Each of the fingers 22 extend either around the side walls of the carrier 10 or through the carrier and terminate at the underside of the carrier at finger terminations 26. These terminations 26 are attached, such as by soldering or spot welding, to the leads 12 of the lead frame 14. The chip carrier 10 may, as in the embodiment of the invention shown, include a seal ring 28 attached to the upper surface of the outer wall 24.

Figure 2:
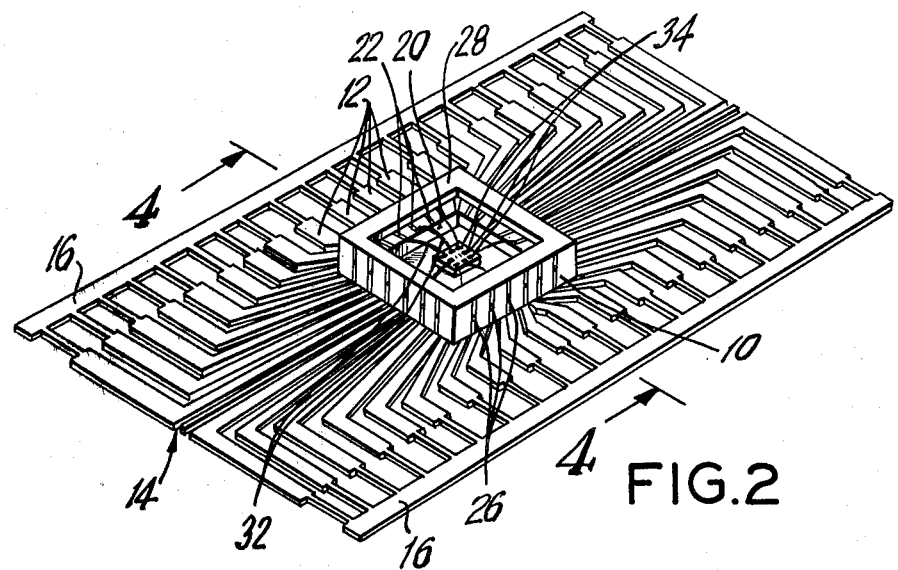
FIG. 2 is a perspective view illustrating the mounting and wiring of the semiconductor chip in the chip carrier of the package.

A semiconductor chip 30, which is to be contained in the package, is die bonded or otherwise fixedly mounted on the recessed portion 18 of the carrier to effect conductive retention between the underside of the chip and the recessed portion of the carrier. Thereafter, as shown in FIG. 2, a plurality of wire bonds 32 are connected between the bonding pads 34 on the chip 30 and the associated fingers 22 on the carrier 10

Once the chip is thus attached and wired to the carrier 10, a lid 36 is placed over, and attached to, the chip carrier 10 and specifically to the seal ring 28, the chip 30 thus being contained within the recessed portion of the chip carrier in a substantially total hermetic environment. The vertical spacing between the upper ends of the inner and outer walls 20 and 24 provides room for the electrical wires to be positioned between the fingers 22 and the bonding pads on the integrated circuit chip and prevents the wires from being crushed by the overlying lid when the lid is put in place. The entire structure is then injection molded with a suitable plastic sealant 38, (FIG. 3) such as an epoxy or silicone compound.

Figure 3:
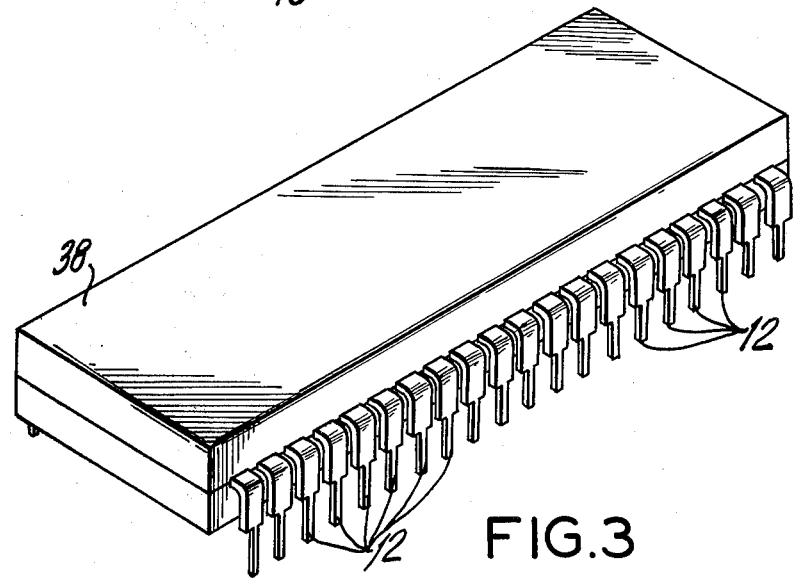
FIG. 3 is a perspective view of the finished package of the invention.

Then, as shown in FIG. 3, the ends of the leads are bent downward in the vertical direction, forming two parallel rows, and the shorting strips 16 are removed leaving the leads 12 unconnected from one another, as shown in FIG. 3, such that the resulting package is in a dual-in-line configuration, as desired. Significantly, this package being formed mostly of plastic rather than ceramic components is also low in cost, as in the conventional plastic dual-in-line package, but is also hermetically sealed as has heretofore been available only in the more costly ceramic package.

Figure 5:
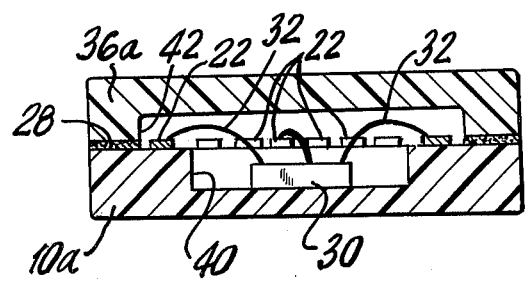
FIG. 5 is a cross-sectional view of a chip carrier, chip, and lid according to an alternative arrangement under the invention.

FIG. 5 illustrates an alternative construction of a chip carrier 10a covered by a modified lid 36a. More specifically, the chip carrier 10a includes, as in the first-described embodiment, a recessed portion or pedestal 18, which in this embodiment, is surrounded by a wall 40. The conductive fingers 22 are formed around and on the inner portion of wall 40, and the seal ring 28 is placed over the outer portion of the wall. The lid 36a, rather than being planar or flat as in the first-described embodiment, includes a peripheral depending lip 42, which is sealed against the seal ring 28 to form the desired hermetic seal for the chip 30 when it is covered by the lid.

It will be apparent from the foregoing description of specific embodiments of the invention that the object of achieving a low-cost, hermetically sealed dual-in-line package for a semiconductor chip has been realized. It will also be apparent that further modifications to the specifically described embodiments may become apparent to those skilled in the art without necessarily departing from the spirit and scope of the invention.

What is claimed is

1. A hermetic package for a semiconductor chip, said package comprising a ceramic chip carrier including a recessed portion having a bottom surface and at least one raised surface surrounding said recessed portion, a plurality of spaced conducting fingers arranged on said raised surface and extending to and terminating at the bottom surface of said chip carrier, a semiconductor chip in said recessed portion and including a plurality of bonding locations thereon, a corresponding plurality of bonding wires connected between said bonding locations and selected ones of said conducting fingers, a lid covering said carrier and sealing said chip within said carrier, and a lead frame separate from said chip carrier and having a significantly larger surface area than that of said chip carrier, said lead frame including a plurality of substantially rigid but bendable space leads constituting a free-standing assembly, each of said leads including spaced inner ends extending inwardly toward and terminating at a central portion of said lead frame to define the periphery of a central opening in said lead frame, said chip carrier being mounted to said lead frame over said central opening and being supported by said inner ends of said leads, said inner ends of said leads also being electrically connected to said conducting fingers at the bottom surface of said chip carrier, each of said leads further including an angular intermediate portion integral with and projecting away from said inner end and an outer portion integral with said intermediate portion and bent downward from said intermediate portion in a direction substantially perpendicular to said intermediate portion, said outer portions of said leads being spaced and substantially parallel to one another and defining the external connections for the package.

2. The package of claim 1, further comprising a seal ring attached to said carrier and arranged intermediate said carrier and said lid.

3. The hermetic package of claim 1, further comprising an encapsulating material encasing said chip carrier and at least a portion of said leads.

4. The package of claim 1, in which said carrier comprises a first raised surface surrounding said recessed portion and a second rasied surface surrounding said first raised surface and at a higher level as compared to said first raised surface.

5. The package of claim 4, in which said conducting fingers are formed on the upper surface of said first raised surface, and further comprising a seal ring attached to the upper part of said second raised surface and arranged intermediate said second raised surface and said lid.

6. A method of fabricating a package in which a semiconductor chip is hermetically sealed, said method comprising the steps of providing a free-standing lead frame including a plurality of integral, substantially rigid but bendable metal leads having inner and outer segments initially arranged in a common plane and interconnected at their outer ends by a conducting strip and terminating at their spaced inner ends at the periphery of a central opening; providing a ceramic chip carrier separate from said lead frame and having a planar surface area significantly less than that of said lead frame, said carrier having a pedestal surrounded by at least one raised wall on which a plurality of spaced conducting fingers are provided and a bottom surface, said conducting fingers extending to and terminating at said bottom surface of said carrier; mounting said chip carrier onto said spaced inner ends of said leads at said central opening of said lead frame and physically supporting said chip carrier on the rigid inner ends of said leads; respectively electrically connecting said end portions of said conducting fingers on said chip carrier to said inner ends of said leads at said central opening; placing a semiconductor chip having bonding locations onto said pedestal in said chip carrier; connecting a plurality of wires between said bonding locations and selected ones of said conducting fingers on said raised wall of said chip carrier; placing a lid over said pedestal and said chip, thereby hermetically sealing said chip in said chip carrier; removing said conducting strip from said lead frame, thereby separating and electrically isolating said leads from one another; bending the outer segments of said leads downwardly along a line intermediate said inner and outer parts so that said outer parts of said leads are substantially perpendicular to said inner parts; and encapsulating said hermetically sealed chip carrier and said inner segments of said leads in a non-conductive material.

* * * * *